United States Patent [19]

Darling et al.

[11] Patent Number: 5,319,847
[45] Date of Patent: Jun. 14, 1994

[54] METHOD AND APPARATUS FOR CONDITIONING LEADS OF PACKAGED ELECTRONIC DEVICES

[75] Inventors: Roy A. Darling, Vista; George T. Rushforth, San Diego, both of Calif.

[73] Assignee: Integrated Concepts, Vista, Calif.

[21] Appl. No.: 92,604

[22] Filed: Jul. 16, 1993

[51] Int. Cl.$^5$ .............................................. H01R 43/00
[52] U.S. Cl. ...................................... 29/827; 29/874; 140/147
[58] Field of Search ................... 29/877, 874, 845; 140/147, 105

[56] References Cited

U.S. PATENT DOCUMENTS

| | | | |
|---|---|---|---|
| 4,371,013 | 2/1983 | Camp | 140/147 |
| 4,397,341 | 8/1983 | Kent | 140/147 |
| 4,481,984 | 11/1984 | Linker | 140/147 |
| 5,210,936 | 5/1993 | Simmons et al. | 29/827 |

*Primary Examiner*—Carl E. Hall
*Attorney, Agent, or Firm*—Frank D. Gilliam

[57] ABSTRACT

A method and apparatus for conditioning the leads of integrated circuit devices having a plurality of sequential stations. The flat device packages have rows of J-shaped leads along the edges. Individual devices are picked up at an input station and moved to a precising nest where the device is accurately located. The device is moved, preferably by a vacuum chuck transport mechanism, to a first conditioning station where a precising bar adjusts lead spread, then a needle is inserted through the row of leads to adjust lead standoff. A coining die reforms the "J" configuration and establishes a precisely uniform seating plane for all leads. A combing blade arrangement then establishes the lead spacing and lead sweep. After leads along two opposite sides of the device are conditioned, the device is moved to a second conditioning station (if required) where these operations are repeated on the other two sides of the device. The device is moved to a final coining station where all of the leads are pressed downwardly together to establish a uniform standoff dimension. The completely conditioned devices are then moved to an output station for packaging and shipment.

15 Claims, 6 Drawing Sheets

METHOD AND APPARATUS FOR CONDITIONING LEADS OF PACKAGED ELECTRONIC DEVICES

BACKGROUND OF THE INVENTION

This invention relates in general to the precise adjustment or "conditioning" of integrated circuit device leads and, more specifically, to a method and apparatus for adjusting the leads sequentially for lead standoff, lead spread, lead sweep and coplaarity.

Various electronic devices, such as integrated circuits and memory devices are mounted in flat plastic or ceramic packages with rows of J-shaped input/output electrical leads extending upwardly above the device surface around two or four edges. The devices are typically surface mounted on solder lands with system leads brought into contact with the device leads or the device leads are inserted into corresponding sockets. The device leads must be precisely located and positioned relative to each other and to the device so that proper electrical contact can be made with system leads. Often during manufacture of the devices or handling after manufacture the leads can be bent out of alignment. For example, the lead standoff, the distance the leads extend above the device upper surface, may vary, making uniform contact with the leads difficult. Also, the lead spread between the upward leg of the leads and the edge of the device may vary and the distance between adjacent leads, lead sweep, may vary.

Attempts have been made to design tools and apparatus for conditioning the leads to correct various misalignments. Prior devices generally are capable of straightening straight leads, such as terminal pins arrayed in rows and columns across a support. Typical of these are the devices is that disclosed by Camp in U.S. Pat. No. 4,371,013, where a straightening bar having one or a plurality of spaced holes or apertures with tapered entrances are lowered over terminal pins to bend them back to a desired straightness and parallel alignment. Similarly, Kent in U.S. Pat. No. 4,397,341 provides a device for straightening terminal pins which includes a plurality of parallel bars having rows of apertures. A support having a plurality of terminal pins in rows and columns is moved toward the aligned bars so that the pins enter the apertures. Alternate bars are reciprocated short distances in opposite directions to flex the pins and align them in a precisely parallel array. While effective with terminal pin arays, these devices are not suitable for aligning curved pins and can only straighten and assure parallelity of straight pins. They are incapable of conditioning the other characteristics mentioned above, such as lead standoff, lead spread and lead sweep.

Other lead conditioning devices have been designed to accommodate rows of leads exiting the edges of electronic components and bent to extend beyond one face of the component. Typical of these are the devices described by Linker in U.S. Pat. No. 4,481,984 and by Liner et al. in U.S. Pat. No. 3,880,205. These devices, however, can only accommodate rows of pins on two opposite sides of a electronic component base, since each passes the components along a trackway having spreader to bend the pins outwardly beyond the desired angle, and simultaneously or subsequently uses a comb-like device to straighten and align the leads in parallel. While effective with some types of leads, such as straight or "banjo" type leads, these devices are not capable of properly configuring curved leads requiring conditioning of lead standoff, spread, sweep, etc.

Thus, there is a continuing need for improved methods, tools and apparatus for rapidly and accurately conditioning the leads on multi-lead electronic devices such as PLCC and other packages using J-shaped leads.

SUMMARY OF THE INVENTION

The above-noted problems, and others, are overcome by the lead conditioning method and apparatus of this invention which sequentially corrects and adjusts lead standoff, lead spread and lead sweep. The overall apparatus begins with an input station where an individual device is picked up, preferably by a vacuum chuck, and moved to a precising nest. The device is precisely located relative to the following stations. A transport mechanism, preferably a vacuum chuck moveable linearly along the series of conditioning stations, moves the device to a first conditioning station where rows of leads along two opposite sides of the device are conditioned. Precising bars are moved against the lead shoulder to adjust for lead spread and to accurately position the part. Half-round precising needles, having the flat needle surface in contact with the device upper surface, are inserted into and through the "J" loop portion of the leads to lift the loops to the desired position. The leads are then coined by a coining die to reform the loop shape. The leads are then combed to establish the desired uniform spacing between adjacent leads A combing blade mechanism having locating webs is moved to fit the webs between adjacent leads and moved to bring spreading cams into contact with adjacent leads, then rotated about the needle to uniformly establish the interlead space. The needles and precising bars are removed to release the device, which is then moved to the second conditioning station where the two remaining opposite rows of leads of equal or different lead count are similarly conditioned. Where the device has leads along only two opposite sides, the device will skip the second conditioning station. The device is then moved to a final coining press station, where the height of all the lead loops above the upper surface of the device is made uniform. Finally, the conditioned devices are moved to an output station for insertion into a shipping tube or the like.

BRIEF DESCRIPTION OF THE DRAWING

Details of the invention, and of certain preferred embodiments thereof, will be further understood upon reference to the drawing, wherein.

DETAILED DESCRIPTION OF PREFERRED EMBODIMENTS

Figure 1:
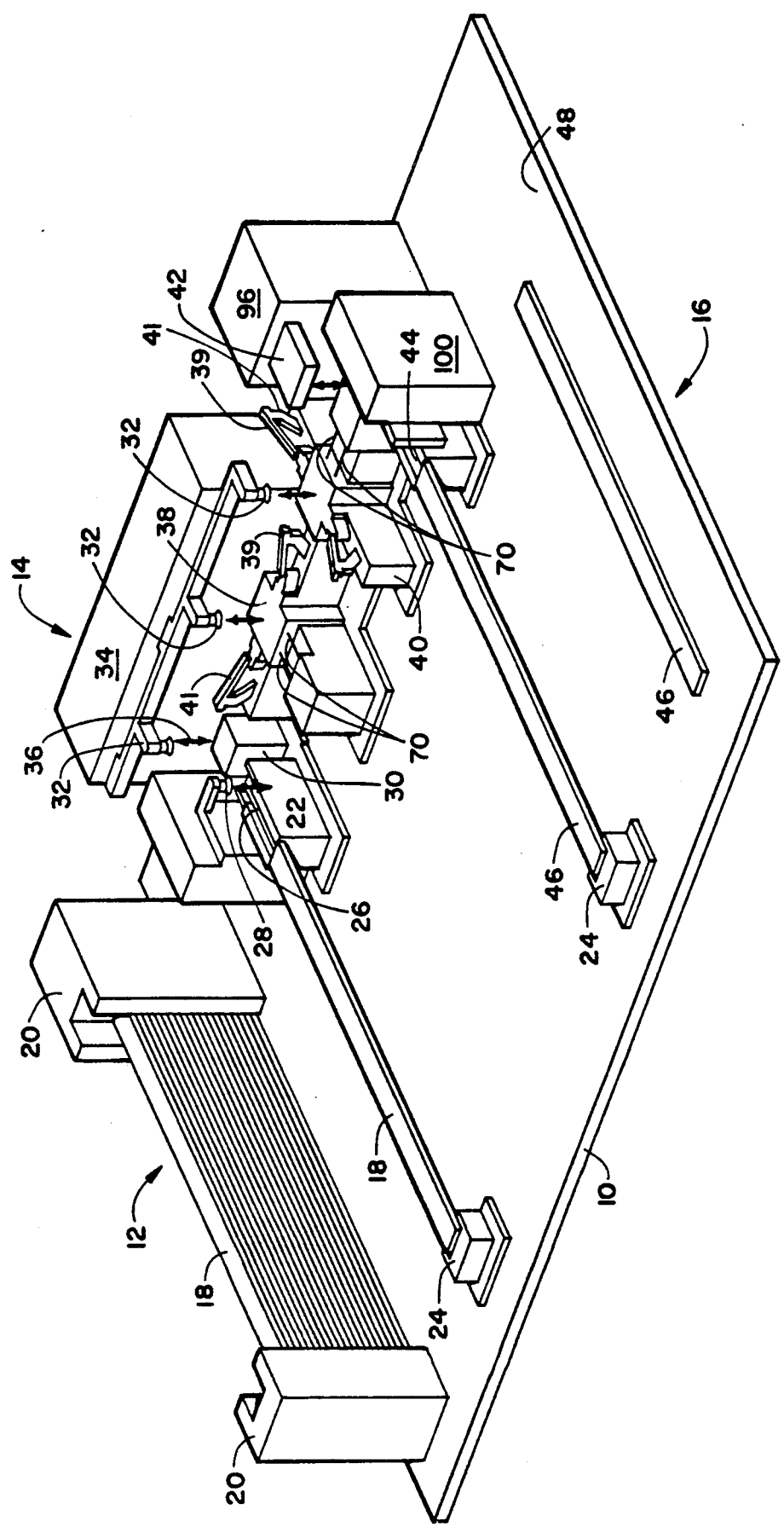
FIG. 1 is a schematic perspective view of the conditioning apparatus of this invention.

Referring now to FIG. 1, there is seen an overall schematic perspective view of the apparatus for conditioning the leads of an integrated circuit or the like. Base 10 supports an input section 12, a conditioning section 14 and an output section 16. All of the components may be manually operated, if desired, although the use of conventional numerical control systems as used in NC machining is preferred to provide rapid, automatic operation of each of the individual components.

Any suitable input section 12 may be used, tailored to the device carrier such as tubes, trays or individual devices. A variety of robotic handlers may be used. In the preferred embodiment shown, the individual devices are shipped in groups in elongated flat tubes 18. If desired, a plurality of tubes 18 may be stacked in holder 20 awaiting processing. Individual tubes 18 are moved manually, by robotic handlers or the like to input station 22, with the other end of the tube 18 supported by support 24. The individual devices within tube 18 are slid out of the tube by a vibratory feeder or the like onto the upper surface 26 of input station 22.

A conventional vacuum chuck 28 movable vertically to engage the top of a device (not shown) on surface 26 and lift it above that surface and horizontally to move a device to precising nest is provided adjacent to input station 22. Vacuum chuck 28 has a soft, sealing lower tube end 32 that contacts the device and a slight vacuum is imposed within tube end 32 so as to hold the device against the tube. While other means, including manual lifting and placing, may be used for moving the devices, the vacuum chuck arrangement is preferred for ease of use and precision of placement.

Precising nest 30 has precisely located tapered walls which index, so that a device released by vacuum chuck 28 thereover will automatically be positioned at a precise location relative to the other components of conditioning section 14. A vacuum chuck lifting a device from the opened precising nest 30 and moving a set distance will always properly align the device exactly in the proper position for the next operation.

A set of three conventional vacuum chucks 32 are mounted for linear movement as indicated by arrows 34 along the conditioning section, and is vertically movable as indicated by arrows 36 to pick up and deposit devices at precise locations along conditioning section 14.

The device is moved from precising nest 30 to first conditioning station 38 by the left chuck 32. As detailed below, the leads along two opposite edges are conditioned at first conditioning station 38. When those operations are completed, the center chuck 32 lifts the device and moves it to second conditioning station 40 where the remaining two opposite rows of leads are conditioned. First and second conditioning stations 38 and 40 are substantially identical, except that the second station is rotated 90° to permit leads along the edges perpendicular to the edges conditioned at first station 38 to be conditioned. Second station 40 will not, of course, be used if the device has leads along only two opposite sides. Each conditioning station includes an actuator 39 for operating the conditioning mechanisms. Actuators 39 may be any selected conventional electro-mechanical, pneumatic, etc. actuator that provides the desired motion, such as a push-pull action, a rocking action, etc. Each actuator 39 has a drive mechanism 41, schematically illustrated as having a drive arm or lever to operate the actuator. Typical actuators and associated drive mechanisms are available from various sources such as, but not limited to Clippard Instrument Lab., Inc. Cincinnati, Ohio, Tol-O-Matic, Inc. Power Block, Minneapolis, Minn. and Compact Air Products, Inc. Westminster, S.C.

Upon completion of lead conditioning, the right vacuum chuck 32 picks up the device and moves it to the coining press 42 where all of the leads are pressed to a uniform height, as detailed below.

The device is then moved to output section 16 by a vacuum chuck assembly not seen in FIG. 1 but substantially identical to vacuum chuck 28. The device is placed on a surface 44 from which it can be picked up for packaging or storage. As shown, a preferred storage arrangement includes a flat tube 46 into which the devices are slid. The tubes can be moved to an output hopper 48 for collection and eventual packaging and shipping.

Details of the various conditioning stations are described in conjunction with the description of FIGS. 3-11, below.

Figure 2:
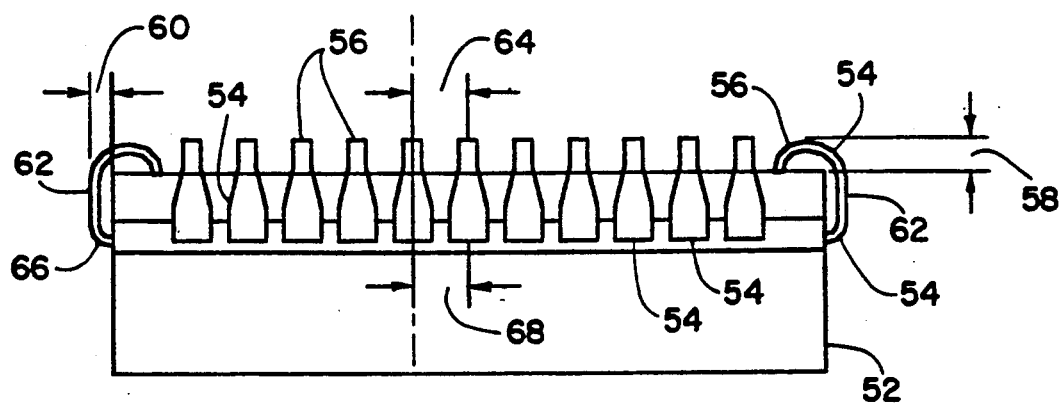
FIG. 2 is an elevation view of a prior art device of the sort conditioned by the method and apparatus.

FIG. 2 is an elevation of a prior art electronic device 50 of the sort conditioned and handled by the apparatus shown in FIG. 1. Typically these devices have a body 52 that houses the electronic components and a plurality of inverted "J" shaped leads 54 connected through the upper sides of the base and form a loop 56 above the upper surface of the base. In most cases, leads are provided along all four sides of base 52. The method and apparatus of this invention can condition leads along all four sides or any lesser number of sides. It is important that all of the leads 54 be very precisely located relative to the edges of base 52 and each other, to assure proper contact with other components that engage the leads when the device is in use.

Among the critical dimensions are the lead standoff 58; that is, the distance the top of loop 56 lies above the upper surface of the device body 52. The lead spread 60, basically the distance between the vertical lead portion 66 must be precisely located relative to the side of body 52 and parallel to that side. The lead sweep 64 dimension must be equal between each pair of adjacent lead loops 56 and must be uniform along the row of leads. Tolerances for each of these dimensions are very tight in commercial and Mil Spec practice. The position of the lead shoulder 66 and lead pitch 68 where leads enter body 52 is rigidly established when the leads are bonded to the body. Slight variations in the position of shoulder 66 can be accommodated when the position of vertical portion 62 is adjusted and slight variations in lead pitch 68 can be accommodated when the positions of lead loops 56 are adjusted, as detailed below.

Figure 3:
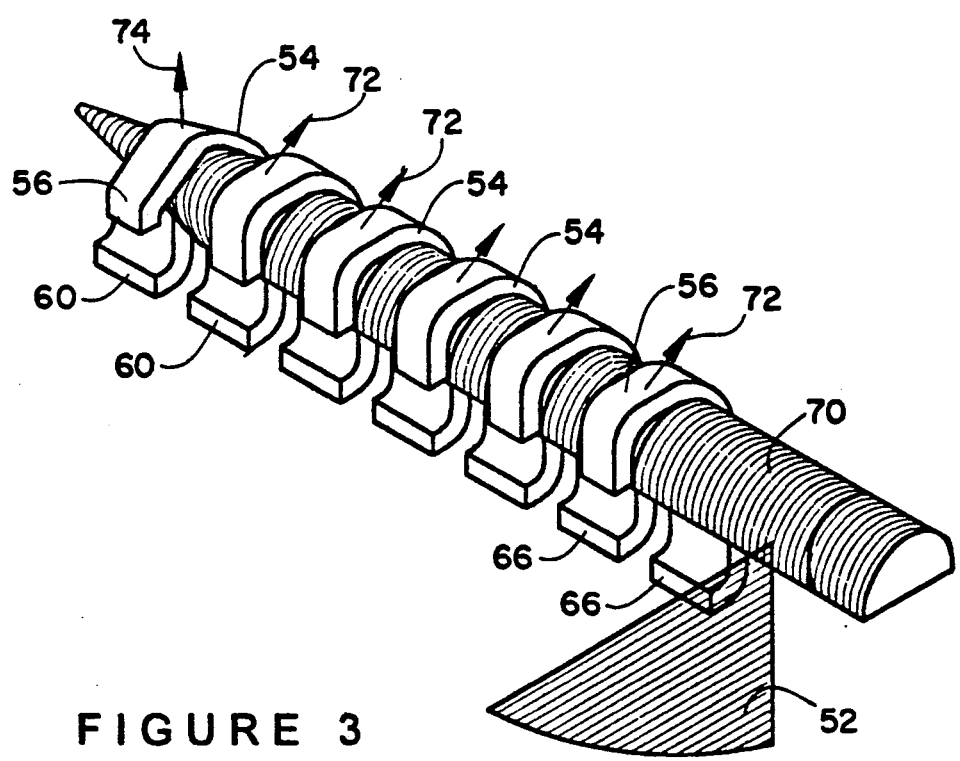
FIG. 3 is a schematic detail perspective view showing the precising needle in operation.
Figure 4:
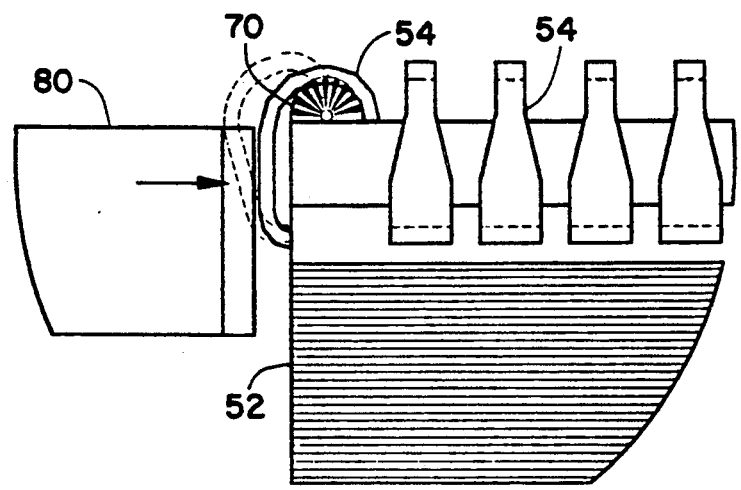
FIG. 4 is a schematic detail elevation view showing precising bar operation.
Figure 5:
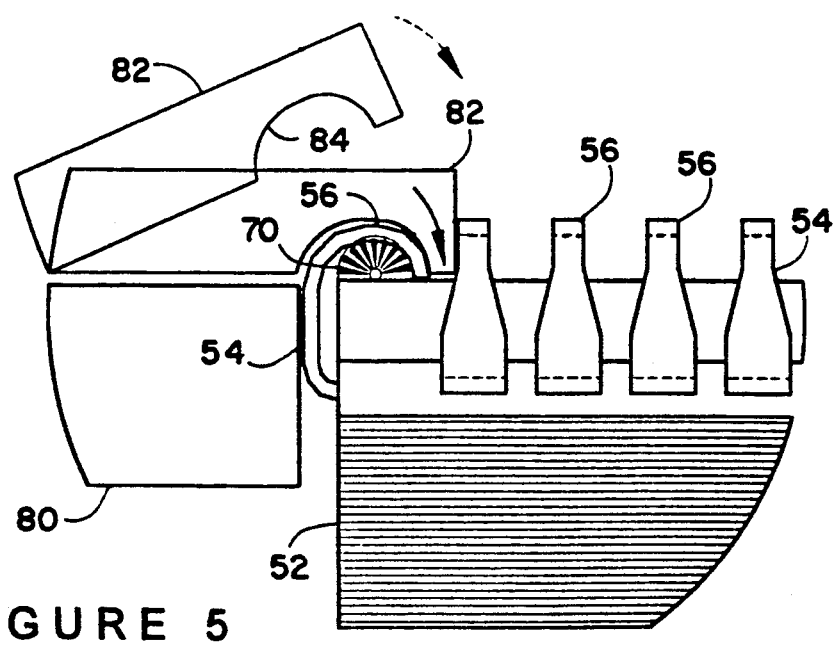
FIG. 5 is a schematic detail elevation view showing coining die operation.
Figure 7:
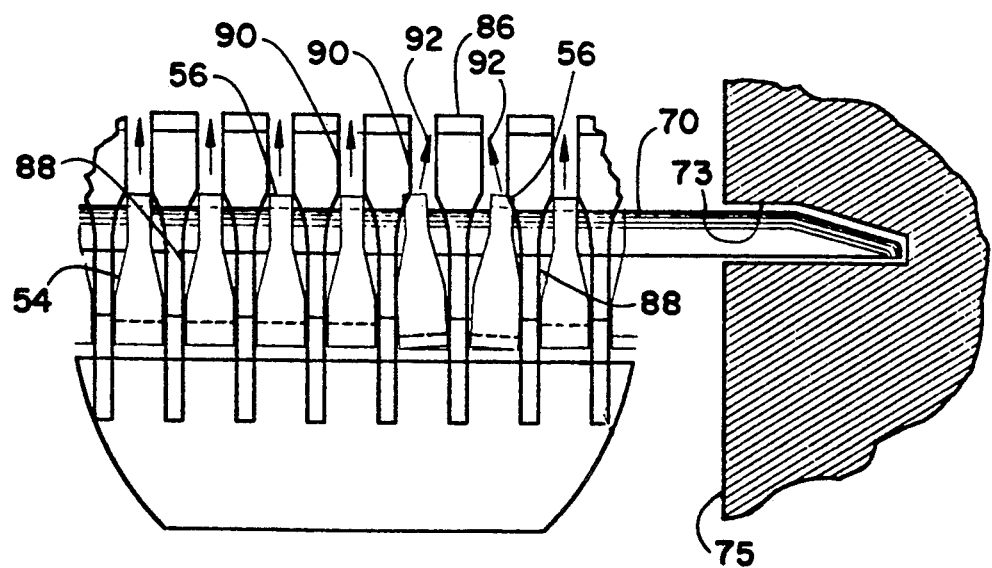
FIG. 7 is a schematic detail front elevation view of the combing blade assembly in the locating position.
Figure 8:
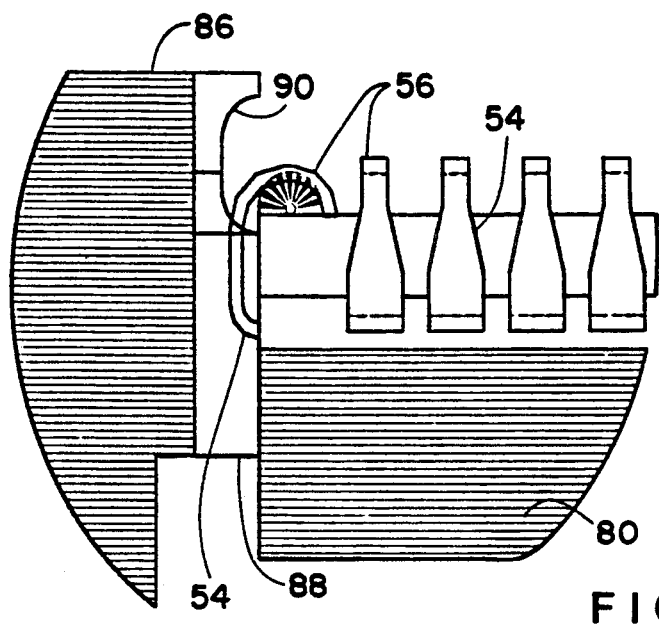
FIG. 8 is a schematic detail side elevation view showing a combing blade assembly in the locating position.

The initial step at first conditioning station 38 is the insertion of needles 70 (as seen in FIGS. 1 and 3) into the loop 56 of the rows of leads 54 on two opposite sides of the device. Needle 70 has a tapered end 72 providing a low insertion point for penetration though a loop that has been substantially flattened. After passing through all of the leads 54, the end of the needle enters a correspondingly shaped hole 73 in a backing block 75, as seen in FIG. 7. The needles 70 have a half-round cross section to provide a flat surface sliding along the upper surface of device body 52 to prevent the needle from twisting and rolling off the device surface and giving a false location for the leads, as seen in FIGS. 5 and 8. As seen in FIG. 3, arrows 72 show the approximate direction of forces on the inner surfaces of loops 56 as the needle 70 passes through and lifts the loops. For illustration, the end loop was more severely bent and partially flattened, changing the force direction indicated by arrow 74. Body 52 which engages the lower shoulder ends 66 of leads 54 is not shown in FIG. 3 for clarity of illustration but is suggested by a schematic representation of the end of the body 52. The lead spread 60 and standoff 58 as seen in FIG. 2 are slightly increased by the needle so that later steps can move the leads to a desired, uniform lead spread and adjust for uniform coplanarity. As seen in FIG. 1, needles 70 are typically mounted on a block assembly 76 that telescopes into the station support 78 as indicated by arrow 80 to move needles 70 into and out of the lead rows.

Just prior to needle insertion, precising bars 80 are moved toward and against leads 54 to precisely locate the device for needle insertion and to establish the correct lead spread 60 (FIG. 2). Bars 80 move leads 54 from the position shown in broken lines to that shown in solid lines. Bars 80 may be moved by any suitable means, such as hydraulic rams, lead screws and the like. Bars 80 are moved into the position shown in FIG. 4 before needles 70 are inserted.

With needle 70 and precising bars 80 in place, a coining die 82 is pivoted as shown in FIG. 5 from the position shown in broken lines to that shown in solid lines to reform the loop portion 56 of each lead to the proper configuration. A groove 84 corresponding to the desired lead loop shape is formed along coining die 82. This coining establishes a new uniform seating plane for all of the device leads 54. The new distance from upper surface of device body 52 to the seating plane at the top of each lead loop 56 slightly greater than the desired final standoff value, which is set later in the conditioning sequence, as detailed below.

Figure 6:
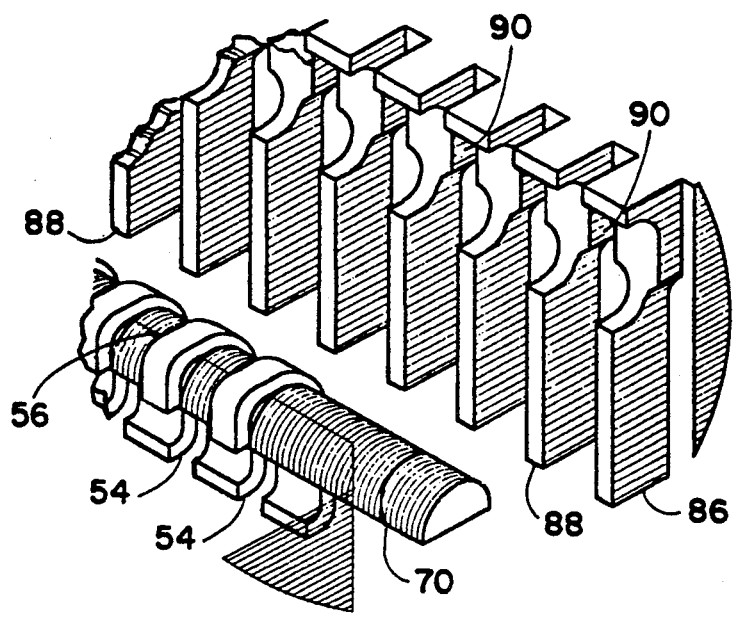
FIG. 6 is a schematic detail perspective view showing the combing blade assembly.

The coining die 82 is then pivoted away in preparation for combing the leads to assure proper spacing of the leads. A locating web assembly 86 is positioned adjacent to the device with needle 70 still in place, as seen in FIG. 6. Assembly 86 includes a plurality of spaced combing blades 88 having a relatively thin lower locating web adapted to fit easily between the shoulders of adjacent leads 54, even if the spacing of leads is off somewhat or some leads are bent toward the top, as seen in FIG. 7. Arrows 92 in FIG. 7 indicate the direction that the tops of certain bent leads have to be bent by the combing assembly. Each combing blade has a thicker upper spreading cam portion 90 having a thickness and spacing corresponding to the desired spacing of the upper loops 56 of leads 54.

Figure 9:
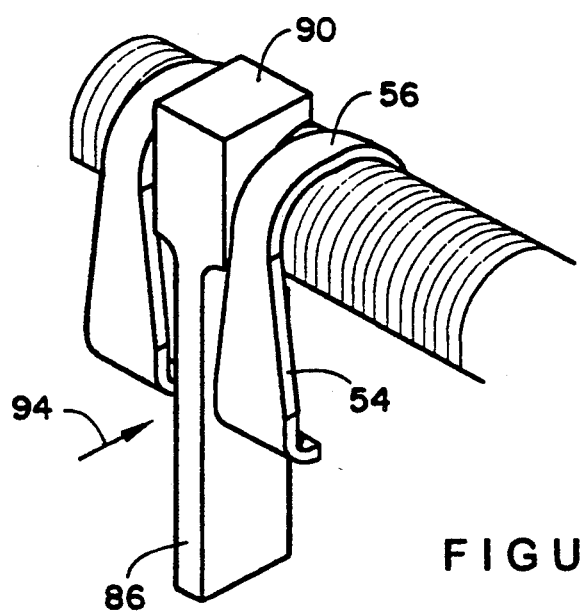
FIG. 9 is a schematic detail perspective view of one spreading cam on a combing blade in operation.
Figure 10:
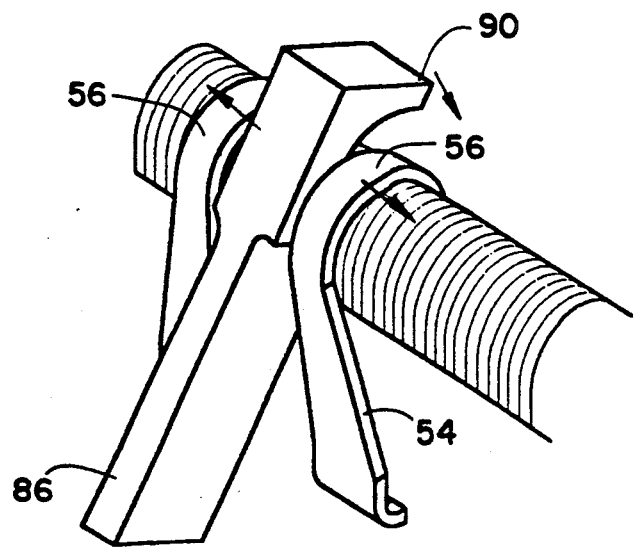
FIG. 10 is a schematic detail perspective view showing further operation of the spreading cam of FIG. 8.
Figure 11:
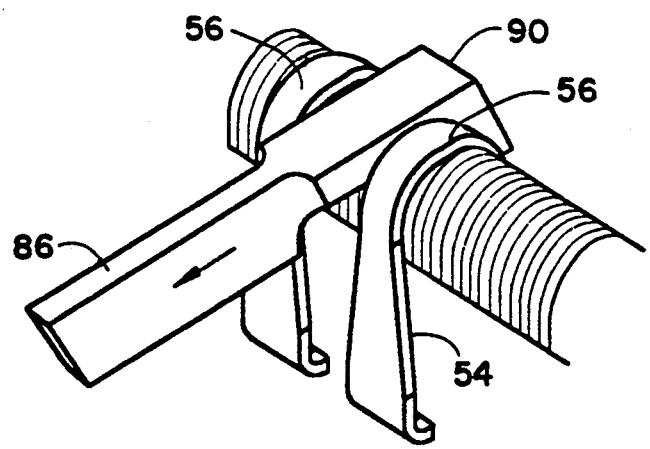
FIG. 11 is a schematic detail perspective view showing the final operating position of the spreading cam of FIG. 8.

As seen in FIGS. 8 and 9, combing assembly 86 is initially moved as seen in FIG. 8 to a position with the thin portions of combing blades 88 between the lower portions of leads 54, as indicated by arrow 94 in FIG. 9. Combing assembly 86 is then rotated in contact with needle 70, using the needle as pivot surface. As the wider spreading cam blade portion 90 moves between adjacent lead upper loops 56, the leads are forced into the proper spacing and alignment, producing the proper lead sweep. Combing assembly 86 is moved by any suitable conventional mechanical means, such as hydraulic cylinders, cams and the like.

Combing assembly 86 and needle 70 are then removed and the corresponding vacuum chuck 32 moves the device to the second conditioning station 40 which is substantially identical to first conditioning station 38, but at 90° to the first station. Second station will not be used if leads are provided along only two opposite device sides, and second station 40 may have a different arrangement of components if the number or spacing of leads is different along the second pair of sides. The precision positioning, coining and combing operations as describe above and detailed in FIGS. 3-11 are repeated to condition the edge lead rows which lie at 90° to the rows conditioned at the first conditioning station. Elements 95 at each conditioning station schematically indicate the locating, coining and combing means illustrated in FIGS. 3-11. As mentioned above, the mechanisms for causing the operation of the components described above are all conventional in the electromechanical art, and could be actuated manually, operated with mechanical synchronization or under conventional computer control.

From second conditioning station 40, the device is moved by the appropriate vacuum chuck 32 to the final conditioning station, the final coining press station 96, as schematically represented in FIG. 1. Here, a plate 42 is moved downwardly as indicated by arrow 98 against the upwardly extending device leads (not seen) and presses them uniformly down to the precise standoff distance above the device body. This final height adjustment operation is desirable, since the rows of leads conditioned at first conditioning station 38 may not have precisely the identical height as those conditioned at second station 40. In production operation, all of the vacuum chucks 32 operate in unison to move an entire set of devices to the next conditioning station at the same time.

After coining, an output vacuum chuck (not seen) corresponding to input vacuum chuck 28, at output section 100 picks up the conditioned device from the final coining station and delivers it to surface 44 for movement into a flat tube 46 for storage and shipping.

Other applications, variations and ramifications of this invention will occur to those skilled in the art upon reading this disclosure. Those are intended to be included within the scope of this invention, as defined in the appended claims.

I claim:

1. Apparatus for conditioning rows of curved leads secured to flat electronic devices, said rows of leads secured to at least one edge of each device, each lead having a loop configuration extending above one surface of the device, said apparatus comprising:
   an input section for receiving devices for lead conditioning;
   a precising station for precisely aligning a device relative to the remainder of said apparatus;
   means for moving said device from said input section to said precising station;
   means for moving said device from said precising station to at least one conditioning station
   said conditioning station comprising:
   a precising bar adjacent to said row of leads;

means for moving said precising bar into pressure contact with said row of leads to move them into a uniform alignment with the edge of said device;

an elongated needle having a tapered free end;

means for moving said needle end along an edge of said device adjacent to said row of leads so that said needle enters said loops and shapes them to the general shape of said needle cross section;

at least one coining die mounted adjacent to said row of leads, said coining die having an elongated recess corresponding to the desired loop shape;

means for moving said die recess into pressure contact with said loops to shape said loops between die recess and needle to a desired configuration;

a combing assembly adjacent to said row of leads;

said combing assembly including a plurality of blades having a narrow segment sized and adapted to fit between adjacent leads and a having a spreading cam segment having a width substantially equal to the desired lead loop spacing;

means for moving said narrow segments between adjacent leads and for pivoting said blades to cause said spreading cams to move between said adjacent leads whereby said leads are moved to an evenly spaced configuration;

means for moving said device from said at least one conditioning station to a coining press station;

said coining press station comprising means for substantially uniformly pressing said lead loops toward said one surface of said device whereby the height of said loops is adjusted to a uniform, selected, height above said one surface;

means for moving said device from said coining press station to an output means; and an output section for receiving conditioned devices.

2. The apparatus according to claim 1 wherein said device is generally rectangular and bears said rows of leads along at least two opposite edges and said conditioning station is provided, said conditioning station includes two parallel needles adapted to simultaneously enter said two parallel rows of lead loops, two precising bars adjacent to said two parallel rows and two coining dies adjacent to said two parallel rows.

3. The apparatus according to claim 1 wherein said device is generally rectangular and bears said rows of leads along at least three edges, two of said conditioning stations are provided and said two stations are arranged to position said device relative to the second station at about 90° to the position of said device in the first station, each of said conditioning stations including two parallel needles adapted to simultaneously enter two parallel rows of lead loops on opposite sides of said device, two precising bars adjacent to said two parallel rows and two coining dies adjacent to said two parallel rows whereby a first pair of opposite rows of lead loops are conditioned at the first conditioning station and the remaining two opposite rows of lead loops are conditioned at the second station.

4. The apparatus according to claim 1 wherein said needle has a generally half-circle cross section, with the flat side of said needle adapted to slide along and be supported by said one surface.

5. The apparatus according to claim 4 further including means for supporting said tapered end of said needle with said needle end extending beyond said row of leads.

6. The apparatus according to claim 1 wherein said precising nest includes a cavity having outwardly flaring walls, whereby a device having a shape corresponding to the bottom of said cavity automatically aligns with said cavity bottom when dropped into said cavity.

7. The apparatus according to claim 1 wherein said means for moving said devices among said sections and stations comprises at least one vacuum chuck assembly.

8. The apparatus according to claim 1 wherein said precising bar is maintained in contact with said loops while said coining die moving means moves said coining die against said loops.

9. The apparatus according to claim 1 wherein said combing assembly is adapted to rock against said needle while said needle is in said row of loops to pivot said combing assembly against said needle to force said spreading combing segment between adjacent loops.

10. The apparatus according to claim 1 wherein said coining press means for pressing said lead loops comprises a flat plate maintained substantially parallel to said one surface of said device.

11. A method for conditioning leads of an electronic device having an edge surrounding one surface, with said leads secured to said edge and extending above said one surface in a loop configuration; comprising the steps of:

moving said device from an input section to a precising station;

precisely aligning said device relative to conditioning stations;

moving said device to a conditioning station;

pressing the row of lead loop portions along said device edge toward said device edge to a uniform selected contour;

inserting an elongated needle into a row of lead loops along at least one edge of said device;

pressing a coining die toward said needle with the lead loops therebetween to shape said loops to the contour of said needle;

moving an assembly comprising a plurality of spaced narrow blades toward said lead row, said blades configured to fit between adjacent leads;

providing a spreading cam segment on said blades, each segment having a width corresponding to the desired lead loop spacing;

rocking said blades to force said cam segments between adjacent lead loops, whereby said loops are uniformly positioned;

moving said device from said conditioning station to a coining press station;

substantially uniformly pressing said lead loops toward said one surfaced to adjust the heights of said loops to a uniform height.

12. The method according to claim 11 wherein at least two conditioning stations are provided in seriatim, each conditioning rows of lead loops along different edges of said device.

13. The method according to claim 11 wherein said devices are moved among sections and stations by bringing a flexible tube into contact with said one surface, applying a vacuum within said tube, and moving said tube and device to the next station.

14. The method according to claim 11 further including providing a half-circle needle configuration and sliding the flat needle surface along said one surface of said device to prevent rotation or side movement of said needle during insertion and establish the arc and perpendicularity of the lead loop portion.

15. The method according to claim 14 further including supporting the free end of said needle after said needle has passed through a row of lead loops.

* * * * *